(12) United States Patent
Yokoyama et al.

(10) Patent No.: US 6,537,645 B1
(45) Date of Patent: Mar. 25, 2003

(54) PHOTOSENSITIVE PASTES AND SUBSTRATES FOR PLASMA DISPLAY PANEL USING THE SAME

(75) Inventors: Chikafumi Yokoyama, Kanagawa pref. (JP); Toshihiro Kasai, Kanagawa pref. (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/890,772

(22) PCT Filed: Jan. 27, 2000

(86) PCT No.: PCT/US00/02146

§ 371 (c)(1),
(2), (4) Date: Aug. 6, 2001

(87) PCT Pub. No.: WO00/50958

PCT Pub. Date: Aug. 31, 2000

(30) Foreign Application Priority Data

Feb. 22, 1999 (JP) .............................................. 11-42874

(51) Int. Cl.$^7$ ................................................ B32B 3/14
(52) U.S. Cl. .................................... 428/119; 430/287.1
(58) Field of Search .............................. 313/581, 584, 313/582; 428/429, 119; 430/287.1

(56) References Cited

U.S. PATENT DOCUMENTS

| | | |
|---|---|---|
| 5,714,840 A | 2/1998 | Tanabe et al. |
| 5,840,465 A | 11/1998 | Kakinuma et al. ....... 430/270.1 |
| 6,023,130 A | 2/2000 | Sakasegawa et al. |
| 6,043,604 A | 3/2000 | Horiuchi et al. |
| 6,197,480 B1 | 3/2001 | Iguchi et al. |
| 6,207,268 B1 | 3/2001 | Kosaka et al. |

FOREIGN PATENT DOCUMENTS

| | | | |
|---|---|---|---|
| EP | 0 722 179 A2 | 7/1996 | ............ H01J/17/16 |
| FR | 2 738 393 | 3/1997 | ............ H01J/17/49 |
| JP | 96119725 | 5/1996 | |
| JP | 97245629 | 9/1997 | |

Primary Examiner—Alexander S. Thomas
(74) Attorney, Agent, or Firm—Robert J. Pechman

(57) ABSTRACT

To provide a photosensitive paste capable of forming a rib having a predetermined shape with comparatively high accuracy, uniformly and rapidly, while inhibiting shrinkage and deformation in case of curing or calcination. A photosensitive paste comprising a ceramic powder, a binder of a silane coupling agent containing a methacrylic group and having a molecular weight of 232 to 290, and a glass powder having a softening point lower than that of a silica, characterized in that said glass powder is contained in the amount of 10–70% by volume based on the total amount of the powders.

2 Claims, 2 Drawing Sheets

PHOTOSENSITIVE PASTES AND SUBSTRATES FOR PLASMA DISPLAY PANEL USING THE SAME

The present invention relates to a photosensitive paste capable of curing upon irradiation of light, and a substrate for plasma display panel (hereinafter referred to as "PDP") having a rib formed by using the paste.

BACKGROUND

It is expected that PDP is used in a thin type large screen display device. In general, PDP is provided with a substrate. A typical substrate for PDP comprises a pair of glass flat plates and a rib (also referred to as a barrier rib or a barrier) having a predetermined size, said glass flat plates facing each other at a distance through said rib. With such a construction, the rib forms a plurality of discharge display cells capable of partitioning a space between a pair of glass flat plates, thereby making it possible to contain a discharge gas such as neon, helium or xenon.

Various methods of producing the rib have been suggested. For example, Japanese Unexamined Patent Publication (Kokai) No. 9-265905 discloses a transfer method comprising the steps of curing a pasty mixture of a glass or ceramic powder, a binder containing an organic additive, and an organosilicate compound by means of heating or irradiation of light to produce a molded article and then calcining the molded article to produce a rib. However, the organic additive contained in the binder of the pasty mixture is liable to inhibit it from absorbing light to rapidly produce a molded article by means of curing caused by light. When the glass flat plate provided with the rib made of such a mixture has a large area, it is liable to make it difficult to perform a heat control in case of curing and calcination with heating. As a result, the temperature distribution becomes non-uniform and, therefore, it is liable to become impossible to impart a predetermined quality to the rib. In case of calcination, the organic additive contained in the binder is burned off and it becomes substantially unnecessary for the rib in the final form.

The pasty mixture used for producing the rib is also disclosed in the publication other than the above publication. For example, Japanese Unexamined Patent Publication (Kokai) No. 8-50811 discloses a photosensitive glass insulating paste comprising a glass powder mainly containing bismuth oxide and zinc oxide, and an acrylic copolymer as a binder. However, when the molded article made by using this paste is calcined to obtain a rib, if the binder is burned off in the same manner as that described above, the glass powder is simultaneously molten to transfer to the burned off portion. As a result, the rib has a volume smaller than that of the molded article by about 20%, accompanying shrinkage of the molded article.

Since the above glass powder mainly contains bismuth oxide and zinc oxide and has low melting point, the glass powder is liable to flow even at comparatively low temperature. In case of calcination, such flow can cause deformation of the molded article and the rib may not have the predetermined shape. The non-uniformity of the shape of the rib not only exerts an influence on the shape of the discharge display cell to impart non-uniformity to the display, but can also lead to leakage of a discharge gas, resulting in reduction of a life of PDP.

Japanese Unexamined Patent Publication (Kokai) No. 8-119725 discloses a photosensitive paste comprising a low-softening point glass powder mainly containing lead oxide, and an alumina powder. As is generally used as a material for shielding radiation, lead has very high mass absorption coefficient. Accordingly, even if the photosensitive paste mainly containing lead is exposed to light, it is liable to take a very long time to cure by light absorption due to lead.

SUMMARY OF THE INVENTION

Figure 1:
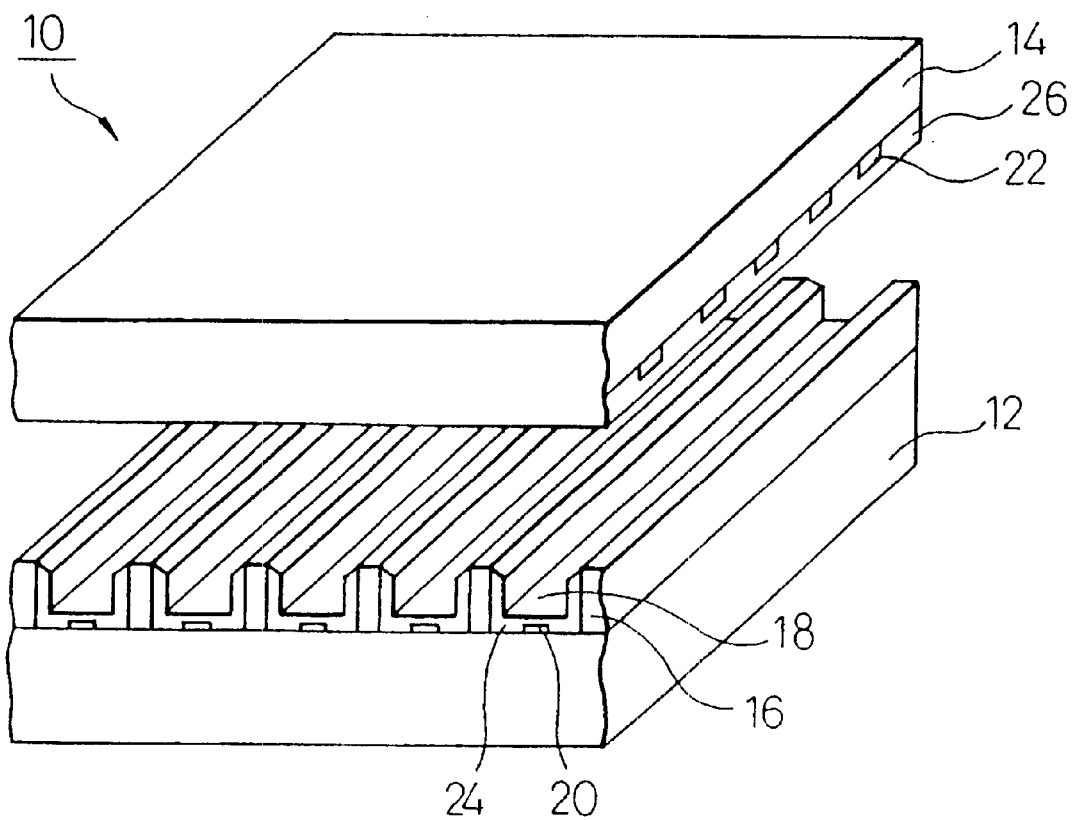
FIG. 1 is a partially exploded perspective view showing one embodiment of the substrate for PDP of the present invention.
Figure 2A:
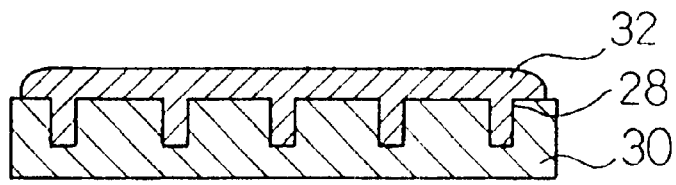
FIG. 2A–E is a cross-sectional view showing a flow sheet of the substrate for PDP of the present invention.
Figure 2B:
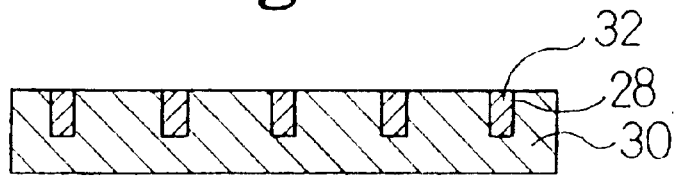
Figure 2C:
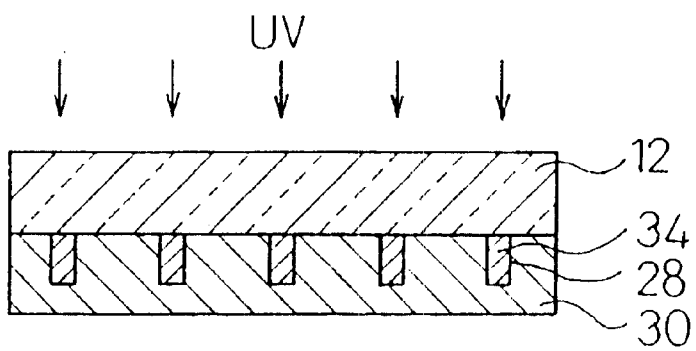
Figure 2D:
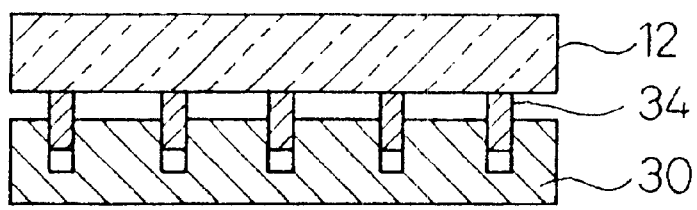
Figure 2E:
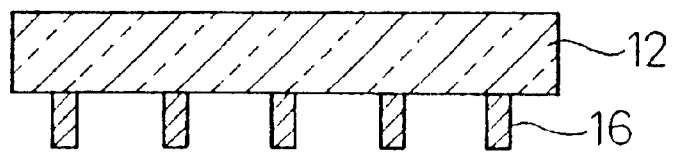

An object of the present invention is to provide a photosensitive paste capable of forming a rib having a predetermined shape with comparatively high accuracy, uniformly and rapidly, while inhibiting shrinkage and deformation in case of curing or calcination, and a substrate for PDP using the same.

To solve the above problems, the present invention has been accomplished. That is, the present invention provides a photosensitive paste comprising:

ceramic powder;

a binder of a silane coupling agent containing a methacrylic group and having a molecular weight of 232 to 290; and a glass powder having a softening point lower than that of a silica, characterized in that:

said glass powder is contained in the amount of 10–70% by volume based on the total amount of the powders.

The present invention also provides a substrate for plasma display panel, comprising a transparent flat plate and a rib provided integrally on said flat plate, characterized in that:

said rib is formed from a photosensitive paste comprising:

ceramic powder;

a binder of a silane coupling agent containing a methacrylic group and having a molecular weight of 232 to 290; and a glass powder having a softening point lower than that of a silica, said glass powder being contained in the amount of 10–70% by volume based on the total amount of the powders, and that:

said ceramic powders are bonded to each other by means of silicon dioxide formed from said silane coupling agent, and said glass powder.

The above term "silica", when it is used in the specification of the present application, refers to general silicon dioxide as being recognized in this technical field. Accordingly, its melting point is normally about 1700° C.

DETAILED DESCRIPTION

Subsequently, the present invention will be described in detail with reference to its embodiments. However, persons with ordinary skill in the art easily arrive at the fact that the present invention is not limited to the embodiments. Note, in the figures, the identical reference numerals are put to the identical or corresponding sections.

In a partially exploded perspective view of FIG. 1, one embodiment of the substrate for PDP of the present invention is schematically shown. This substrate 10 for PDP is used in so-called AC type PDP, and is preferably provided with transparent flat plates made of easily available soda-lime glass, facing each other in a distance; i.e., a back plate 12 and a front plate 14. A plurality of ribs 16 having a predetermined shape and a predetermined dimension are provided between the back plate 12 and front plate 14, to partition the space between them, thereby making it possible to form a plurality of discharge display cells 18. In each discharge display cell 18, an address electrode 20 is provided on the back plate 12 along the rib, and a transparent bus electrode 22 made of an indium tin oxide (ITO) is provided perpendicular to the rib 16 on the front plate 14. A discharge gas such as neon, helium or xenon can be contained between the address electrode 20 and bus electrode 22, thereby making it possible to emit light due to discharging. A fluorescent layer 24 is provided on each address electrode 20 in a predetermined order, thereby making it possible to realize color display. On the front plate 14 and bus electrode 22, a transparent dielectric layer 26 is provided to coat the bus electrode 22, thereby contributing to elongation of life of PDP due to inhibition of sputtering of the bus electrode 22.

In this embodiment, the rib 16 is formed from a transparent photosensitive paste capable of curing by irradiation of light, and is integrally attached on at least one of the back plate 12 and front plate 14.

More particularly, the photosensitive paste basically contains a ceramic powder, a binder made of a silane coupling agent having a methacrylic group, and a glass powder, and an organic additive, which is not necessary in case of calcination, is not contained in the binder.

The ceramic powder is used for imparting a predetermined shape to the rib, and is preferably composed of alumina, silica, titania or wollastonite, or a mixture thereof, which has high strength.

The binder is used for retention of the shape of the rib. In this embodiment, this binder is particularly composed of a silane coupling agent having a methacrylic group. When such a silane coupling agent is exposed to light such as ultraviolet ray, it forms a network capable of containing the ceramic powder through the methacrylic group, thereby making it possible to support the ceramic powder.

The binder made of this silane coupling agent can form polymeric silicon dioxide having high melting point, unlike a binder made of an organic matter. As described above, when the network is formed by the silane coupling agent, the network is substantially retained by silicon dioxide even after calcination at comparatively high temperature. Such a silane coupling agent is preferably γ-methacryloxypropyltrimethylmethoxysilane, γ-methacryloxypropylmethyldimethoxysilane, γ-methacryloxypropyltriethoxysilane or γ-methacryloxypropylmethyldiethoxysilane having a molecular weight of about 232 to 290 in view of availability.

The glass powder of the photosensitive paste is used for imparting a dense structure to the rib to enhance the strength. Basically, this glass powder is sufficient only by filling a small space between the network made of silicon dioxide and ceramic powders surrounded with the network. There is no network and, therefore, it is not necessary to fill a large space between ceramic powders with the glass powders. As a result, the strength of the rib can be enhanced by comparatively small amount of the glass powder. Even if the glass powder mainly contains lead having high mass absorption coefficient, it hardly exerts an influence on the rate of light-curing. Use of the glass powder made of an expensive low-melting point glass can also be inhibited. Basically, the glass powder is contained in the amount of 10 to 70% by volume based on the total amount of the powders contained in the paste. The glass powder is preferably contained in the amount of 20 to 50% by volume, thereby to further enhance the strength of the rib.

In this embodiment, when the network is subjected to heating, together with the glass powder, the network is retained as far as the temperature does not reach the melting point of silicon dioxide constituting the network. Therefore, the change in volume as described in the art does not arise, substantially. Even if a change in volume arises, the degree of change is small.

When the front plate or back plate is made of a soda glass having an annealing point of 550° C., the glass powder has preferably a softening point which is 450–550° C. lower than that of the annealing point. The reason is as follows. That is, even if the glass powder having such a softening point flows with heating together with the front plate or back plate of soda-lime glass to penetrate into the space, it is possible to prevent thermal deformation of the front or back plate. The glass powder is basically composed of lead glass containing a predetermined amount of bismuth, boron, zinc, phosphate, lead, titanium or a combination thereof, aluminum phosphate glass, titanium borate glass, bismuth glass or zinc glass so that it has the above softening point. To reduce the fight-curing time of the silane coupling agent without taking high mass absorption coefficient into consideration, bismuth, boron, zinc, phosphate, lead, titanium or a combination thereof is preferably contained. At this time, each composition of them is not specifically limited. In case of zinc oxide, it is preferably contained in the amount of at least 10–80% by weight taking the rate of light-curing into consideration.

If necessary, a mineral acid such as hydrochloric acid or nitric acid may be contained for hydrolysis of the silane coupling agent so that this photosensitive paste is converted into sol. In such a case, the photosensitive paste is dried without being gelled, thereby making it possible to disperse the ceramic powder. The viscosity does not vary depending on the amount of water and is maintained within the range from $1 \times 10^4$ to $1 \times 10^5$ cps.

Next, the method of producing the substrate for PDP will be described with reference to FIG. 2. In FIG. 2, a flow sheet of the method of producing the substrate for PDP is shown.

First, a mold 30 having a concave portion 28 corresponding to the shape of the rib of the substrate for PDP is prepared. Then, the above photosensitive paste 32 is applied on the mold 30 and the concave portion 28 is filled with the photosensitive paste (see step A). Particularly, when the above viscosity is imparted to the photosensitive paste 32, such filling can be performed with high accuracy. The concave portion 28 may have a trapezoidal cross section. Alternatively, a releasant (not shown) may be applied on the surface of the concave portion to impart high releasability to the mold. Excess photosensitive paste 32 applied outside the concave portion 28 is removed by using a scraper (not shown) to make the surface of the mold 30 smooth (see step B).

Then, a transparent back plate 12 is placed on the mold 30 to contact it with the photosensitive paste 32. As shown in the step C by using arrows, ultraviolet rays (UV) are irradiated to the photosensitive paste 32 through the back plate 12. At this time, ultraviolet rays can be irradiated to only a silane coupling agent by removing an organic additive from or adding lead to the photosensitive paste. As a result, curing of the photosensitive paste is rapidly performed to form a molded article 34 shown in the step C. Since such curing is performed only by irradiation of light, it becomes unnecessary to take a heat control in case of curing by heating into consideration.

After irradiation of ultraviolet rays, the molded article 34 bonded integrally with the back plate 12 is removed from the mold 30 (see step D). Then, the molded article 34 is put in a calcination oven (not shown), together with the back plate 12, and calcined at a predetermined temperature to obtain a rib 16 (see step E). Also in such a case, since the organic additive is not contained in the binder, it becomes unnecessary to take a heat control in case of curing by heating into consideration. Before and after calcination, the above-described network is substantially retained to reduce shrinkage of the molded article. Accordingly, it is possible to produce a rib corresponding to the shape of the concave portion with good accuracy.

If necessary, an address electrode is formed between ribs on the back plate and a fluorescent layer may be formed on the address layer. Then, a transparent front plate, on which a bus electrode is previously formed, may be provided through the rib so as to face with the back plate. After the peripheral portion of the front plate and back plate is airtightly sealed by using a sealing material, a discharge display cell may be formed between the front plate and back plate. Then, a substrate for PDP may be produced by evacuating the discharge display cell under reduced pressure and introducing a discharge gas into the discharge cell.

The present invention was described above in accordance with the AC type substrate for PDP, but persons with ordinary skill in the art can easily arrive at the fact that the present invention can also be applied to the DC type substrate for PDP. Regardless of the AC or DC type substrate for PDP, formation of the electrode may be performed before forming the rib.

EXAMPLES

The present invention will be described in more detail with reference to the following examples. It will be appreciated that the present invention is not limited to the following examples.

Example 1

To prepare a photosensitive paste, 4 g of γ-methacryloxypropylmethyldimethoxy-silane (manufactured by Nippon Union Carbide Co.) was used as the silane coupling agent. 1 g of a mixed solution of an aqueous 0.01 N nitric acid solution and ethanol in molar ratio of 2:1 was also prepared. These components were mixed with sufficiently stirring, and then the mixture was allowed to stand at 70° C. for 12 hours and reacted. After the reaction product was dried at 70° C., water and alcohol were removed by evaporation.

To the dried reaction product, 0.05 g of Irgacure 819 (bis(2,4,6-trimethylbenzoyl)-phenylphosphine oxide, manufactured by Ciba-Gigy Co.) as an initiator for light-curing and 0.05 g of POCA (phosphate propoxyalkyl polyol) as a surfactant were added.

80% by volume of α-alumina having an average particle diameter of 2.1 μm (AL-45-2, manufactured by Showa Denko Co., Ltd.) was mixed with 20% by volume of a glass powder having an average particle diameter of 3.6 μm (softening point: 483° C., OC-530, manufactured by Okuno Seiyaku-Kogyo Co., Ltd.) comprising $PbO-SiO_2-B_2O_3$ as a main component to prepare a mixed powder, and then 20 g of the mixed powder was added to obtain a photosensitive paste.

A mold having a concave portion corresponding to the shape of a rib was used and the concave portion was filled with the photosensitive paste. A transparent back plate was placed on this mold to contact it with the photosensitive paste of the concave portion. Using an ultraviolet (UV) light source (trade name: Unicure) manufactured by Ushio Denki Co., Ltd., UV having a wavelength of 200 to 450 nm was irradiated for 30 seconds. The molded article integrated with the back plate was removed from the mold, and then calcined in a calcination oven at 500° C. to obtain a rib.

It was confirmed that the rib of this example is not easily broken even if it is contacted with fingers or a glass plate. As is apparent from Table 1 below, the rib is not broken only when an alumina ball having a diameter of 10 mm and a weight of about 2 g is dropped from 15 mm above the rib and the surface hardness of the rib measured by using a pencil is not less than 4 H. Furthermore, it became clear that the rib causes shrinkage of merely 2.6% in the direction perpendicular to the back plate before and after calcination.

Example 2

In substantially the same manner as that described in Example 1 except for using a mixed powder prepared by mixing 70% by volume of α-alumina with 30% by volume of a glass powder in place of the mixed powder of 80% by volume of α-alumina and 20% by volume of the glass powder, a photosensitive paste was prepared and a rib was produced.

It was confirmed that the fib of this example is not also easily broken even if it is contacted with fingers or a glass plate. As is apparent from Table 1 below, the rib is not broken only when an alumina ball is dropped from 45 mm above the rib and the surface hardness of the rib measured by using a pencil is not less than 4 H. Furthermore, it became clear that the rib causes shrinkage of merely 2.5% in the direction perpendicular to the back plate before and after calcination.

Example 3

In substantially the same manner as that described in Example 1 except for using a mixed powder prepared by mixing 60% by volume of α-alumina with 40% by volume of a glass powder in place of the mixed powder of Example 1, a photosensitive paste was prepared and a rib was produced.

It was confirmed that the rib of this example is not also easily broken even if it is contacted with fingers or a glass plate. As is apparent from Table 1 below, the rib is not broken only when an alumina ball is dropped from 75 mm above the rib and the surface hardness of the rib measured by using a pencil is not more than 4 H. Furthermore, it became clear that the rib causes shrinkage of merely 3.9% in the direction perpendicular to the back plate before and after calcination.

Example 4

In substantially the same manner as that described in Example 1 except for using a mixed powder prepared by mixing 50% by volume of α-alumina with 50% by volume of a glass powder in place of the mixed powder of Example 1, a photosensitive paste was prepared and a rib was produced.

It was confirmed that the rib of this example is not also easily broken even if it is contacted with fingers or a glass plate. As is apparent from Table 1 below, the rib is not broken only when an alumina ball is dropped from 85 mm above the rib and the surface hardness of the rib measured by using a pencil is not less than 4 H. Furthermore, it became clear that the rib causes shrinkage of merely 11.6% in the direction perpendicular to the back plate before and after calcination.

Comparative Example 1

In substantially the same manner as that described in Example 1 except for using a mixed powder prepared by mixing 90% by volume of α-alumina with 10% by volume of a glass powder in place of the mixed powder of Example 1, a photosensitive paste was prepared and a rib was produced.

It was confirmed that the rib of this comparative example is not also easily broken even if it is contacted with fingers or a glass plate. Furthermore, it became clear that the rib causes shrinkage of merely 1.1% in the direction perpendicular to the back plate before and after calcination. However, as is apparent from Table 1 below, the rib is not broken when an alumina ball is dropped from 3 mm above the rib. It was also found that the surface hardness of the rib measured by using a pencil is 2 B.

Comparative Example 2

In substantially the same manner as that described in Example 1 except for using a mixed powder prepared by mixing 30% by volume of α-alumina with 70% by volume of a glass powder in place of the mixed powder of Example 1, a photosensitive paste was prepared and a rib was produced. However, the shape of the rib is drastically broken. As a result, shrinkage of the rib before and after calcination could not be measured and the alumina ball could not dropped on the rib.

Comparative Example 3

In substantially the same manner as that described in Example 1 except for using only α-alumina in place of the mixed powder of the α-alumina and glass powders, a photosensitive paste was prepared and a rib was produced.

It was confirmed that the rib of this comparative example is not also easily broken even if it is contacted with fingers or a glass plate. Furthermore, it became clear that the rib does not substantially cause shrinkage in the direction perpendicular to the back plate before and after calcination. However, as is apparent from Table 1 below, the rib is not broken when an alumina ball is dropped from 2 mm above the rib. It was also found that the surface hardness of the rib measured by using a pencil is 4 B.

Comparative Example 4

In substantially the same manner as that described in Example 1 except for using only a glass powder in place of the mixed powder of the α-alumina and glass powder, a photosensitive paste was prepared and a rib was produced.

It was confirmed that the rib of this comparative example is not easily broken even if it is contacted with fingers or a glass plate. As is apparent from Table 1 below, the rib is not broken when an alumina ball is dropped from 40 mm above the rib and the surface hardness of the rib measured by using a pencil was not less than 4 H. However, it became clear that the rib causes shrinkage of 23.5%, which is at least twice as much as that of the above examples, in the direction perpendicular to the back plate before and after calcination.

| | Volume ratio (%) of α-alumina | Volume ratio (%) of low-melting point glass | Impact resistance to alumina ball | Pencil hardness | Shrinkage (%) |
|---|---|---|---|---|---|
| Example 1 | 80 | 20 | 15 mm | ≧4H | 2.6 |
| Example 2 | 70 | 30 | 45 mm | ≧4H | 2.5 |
| Example 3 | 60 | 40 | 75 mm | ≧4H | 3.9 |
| Example 4 | 50 | 50 | 85 mm | ≧4H | 11.6 |
| Comp. Example 1 | 90 | 10 | 3 mm | 2B | 1.1 |
| Comp. Example 2 | 30 | 70 | — | — | — |
| Comp. Example 3 | 100 | 0 | 2 mm | 4B | 0 |
| Comp. Example 4 | 0 | 100 | 40 mm | ≧4H | 23.4 |

What is claimed is:

1. A photosensitive paste comprising:

a ceramic powder;

a binder of a silane coupling agent containing a methacrylic group and having a molecular weight of 232 to 290; and a glass powder having a softening point lower than that of a silica, characterized in that:
   said glass powder is contained in the amount of 10–70% by volume based on the total amount of the powders.

2. A substrate for a plasma display panel, comprising a transparent flat plate and a rib provided integrally on said flat plate, characterized in that:

said rib is formed from a photosensitive paste comprising:
   ceramic powder;
   a binder of a silane coupling agent containing a methacrylic group and having a molecular weight of 232 to 290; and
   a glass powder having a softening point lower than that of a silica, said glass powder being contained in the amount of 10–70% by volume based on the total amount of the powders, and that:
   said ceramic powders are bonded to each other by means of silicon dioxide formed from said silane coupling agent, and said glass powder.

* * * * *

UNITED STATES PATENT AND TRADEMARK OFFICE
CERTIFICATE OF CORRECTION

PATENT NO. : 6,537,645 B1
DATED : March 25, 2003
INVENTOR(S) : Chikafumi Yokoyama et al.

It is certified that error appears in the above-identified patent and that said Letters Patent is hereby corrected as shown below:

Column 2,
Line 13, delete "A-E" following "2".

Column 4,
Line 26, "fight-curing" should read -- light-curing --.

Column 6,
Line 30, "fib" should read -- rib --.

Signed and Sealed this

Thirtieth Day of December, 2003

JAMES E. ROGAN
*Director of the United States Patent and Trademark Office*